(12) United States Patent
Hiraoka (10) Patent No.: US 11,968,508 B2
(45) Date of Patent: Apr. 23, 2024

(54) ELECTROACOUSTIC TRANSDUCER (71) Applicant: Panasonic Intellectual Property Management Co., Ltd., Osaka (JP)

(72) Inventor: Hidetoshi Hiraoka, Kyoto (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 149 days.

(21) Appl. No.: 17/813,181

(22) Filed: Jul. 18, 2022

(65) Prior Publication Data

US 2023/0036168 A1    Feb. 2, 2023

(30) Foreign Application Priority Data

Jul. 30, 2021   (JP) .................................. 2021-124875

(51) Int. Cl.
*H04R 7/18*   (2006.01)
*H03H 9/24*   (2006.01)

(52) U.S. Cl.
CPC ................. *H04R 7/18* (2013.01); *H03H 9/24* (2013.01)

(58) Field of Classification Search
CPC .......... H04R 7/18; H04R 9/041; H04R 9/027; H04R 7/12; H04R 9/046; H04R 9/025; H04R 9/06; H04R 2400/11; H04R 7/20; H04R 7/127; H04R 1/22; H04R 9/043; H03H 9/24; H03R 9/24
USPC ........ 181/173, 150; 381/401, 422, 403, 421, 381/420, 397, 412, 396, 96, 89, 120
See application file for complete search history.

(56) References Cited

U.S. PATENT DOCUMENTS

| | | | | |
|---|---|---|---|---|
| 5,323,469 A | * | 6/1994 | Scholz ..................... | H04R 7/24 381/403 |
| 5,848,173 A | * | 12/1998 | Sato ......................... | H04R 7/18 381/345 |
| 2008/0159583 A1 | * | 7/2008 | Tanaka .................... | H04R 7/14 381/398 |
| 2008/0247595 A1 | * | 10/2008 | Henry ..................... | H04R 9/06 381/398 |
| 2013/0064414 A1 | * | 3/2013 | Flavignard ............. | H04R 1/30 381/412 |

(Continued)

FOREIGN PATENT DOCUMENTS

| | | | | |
|---|---|---|---|---|
| JP | 2019-068144 A | | 4/2019 | |
| WO | 2019/065344 A1 | | 4/2019 | |
| WO | WO2019065344 | * | 4/2019 | .............. H04R 7/12 |

*Primary Examiner* — Carolyn R Edwards
*Assistant Examiner* — Julie X Dang
(74) *Attorney, Agent, or Firm* — GREENBLUM & BERNSTEIN, P.L.C.

(57) ABSTRACT

An electroacoustic transducer includes a diaphragm, a tubular first sliding component which surrounds an outer peripheral portion of the diaphragm, a ring-shaped second sliding component which is attached to an outer rim of the diaphragm and slides against an inner peripheral surface of the first sliding component, and a first low-friction membrane interposed between the inner peripheral surface of the first sliding component and an outer peripheral surface of the second sliding component. The first low-friction membrane includes: a swollen body which includes a first polymer chain and a plurality of second polymer chains which branch from the first polymer chain as side chains; and a grease which permeates the second polymer chains.

7 Claims, 7 Drawing Sheets

(56) References Cited

U.S. PATENT DOCUMENTS

| | | | |
|---|---|---|---|
| 2015/0125025 A1* | 5/2015 | Button | H04R 1/00 381/401 |
| 2017/0201834 A1* | 7/2017 | Nozaki | H04R 7/16 |
| 2020/0228900 A1 | 7/2020 | Hiraoka et al. | |

* cited by examiner

ELECTROACOUSTIC TRANSDUCER

CROSS REFERENCE TO RELATED APPLICATION

The present application is based on and claims priority of Japanese Patent Application No. 2021-124875 filed on Jul. 30, 2021.

FIELD

The present disclosure relates to an electroacoustic transducer.

BACKGROUND

Conventionally, an electroacoustic transducer which produces sound by electrically vibrating a diaphragm, and an electroacoustic transducer which converts the vibration of the diaphragm that is caused by sound into an electric signal include a sliding portion which guides the diaphragm so as to vibrate along one axis.

Patent Literature (PTL) 1 discloses a technique in which a sliding portion includes a low friction component in order to stabilize the vibration of the diagraph by narrowing a magnetic gap serving as the sliding portion. The low friction component includes a polymer brush which is capable of relieving the stress concentration and which is swollen with liquid.

CITATION LIST

Patent Literature

PTL 1: Japanese Unexamined Patent Application Publication No. 2019-68144

SUMMARY

However, the loudspeaker disclosed in PTL 1 can be improved upon.

The present disclosure provides an electroacoustic transducer capable of improving upon the above related art.

An electroacoustic transducer according to one aspect of the present disclosure includes: a diaphragm which vibrates to produce sound or which is vibrated by sound; a first sliding component which is tube-shaped and surrounds an outer peripheral portion of the diaphragm; a second sliding component which is ring-shaped and is attached to an outer rim of the diaphragm, the second sliding component sliding against an inner peripheral surface of the first sliding component; and a first low-friction membrane which is interposed between the inner peripheral surface of the first sliding component and an outer peripheral surface of the second sliding component. The first low-friction membrane includes: a swollen body which includes a first polymer chain and a plurality of second polymer chains which branch from the first polymer chain as side chains; and a grease which permeates the plurality of second polymer chains.

An electroacoustic transducer according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENT

Hereinafter, an embodiment of an electroacoustic transducer according to the present disclosure will be described with reference to the drawings. It should be noted that the following embodiment merely shows an example in order to describe the present disclosure, and is not intended to limit the present disclosure. For example, the shapes, structures, materials, structural components, relative positional relations, connection states, numerical values, mathematical formulae, each step in methods, the order of the steps, and the like shown in the following embodiment are mere examples, and may include the matters which are not described in the following embodiment. In addition, geometric expressions, such as parallel and orthogonal, may be used. However, these expressions do not indicate mathematical rigor, and include substantially allowable errors, misalignment and the like. The expressions, such as simultaneously and same, also include substantially allowable ranges.

Moreover, for the sake of illustrating the present disclosure, the drawings are schematic views in which emphasis, omission, or ratio adjustment is added as needed, and may differ in shape, positional relation, and ratio from the actual ones.

Moreover, a plurality of inventions may be comprehensively described below as one embodiment. Part of the matters described below is described as optional structural components in the present disclosure.

Here, the term "slide" means that two different components move smoothly against each other. However, in the specification and claims, the term "slide" also means that two different components move smoothly against and in indirect contact with as well as in direct contact with east other. The term "move smoothly against and in indirect contact with east other" means, for example, that one component moves along the other component with another component, such as a first low-friction membrane, interposed in between.

The present disclosure relates to an electroacoustic transducer including a device, such as a loudspeaker, which converts an electric signal into sound, and a device, such as a microphone, which converts sound into an electric signal. A diagraph included in a conventional electroacoustic transducer has an outer peripheral portion that is fixed via a ring-shaped resilient membrane that is so-called an edge. The edge influences the vibration of the diagraph, which impairs reproducibility between sound and electric signals. The present disclosure is provided based on this knowledge of the inventors.

Embodiment 1

Figure 1:
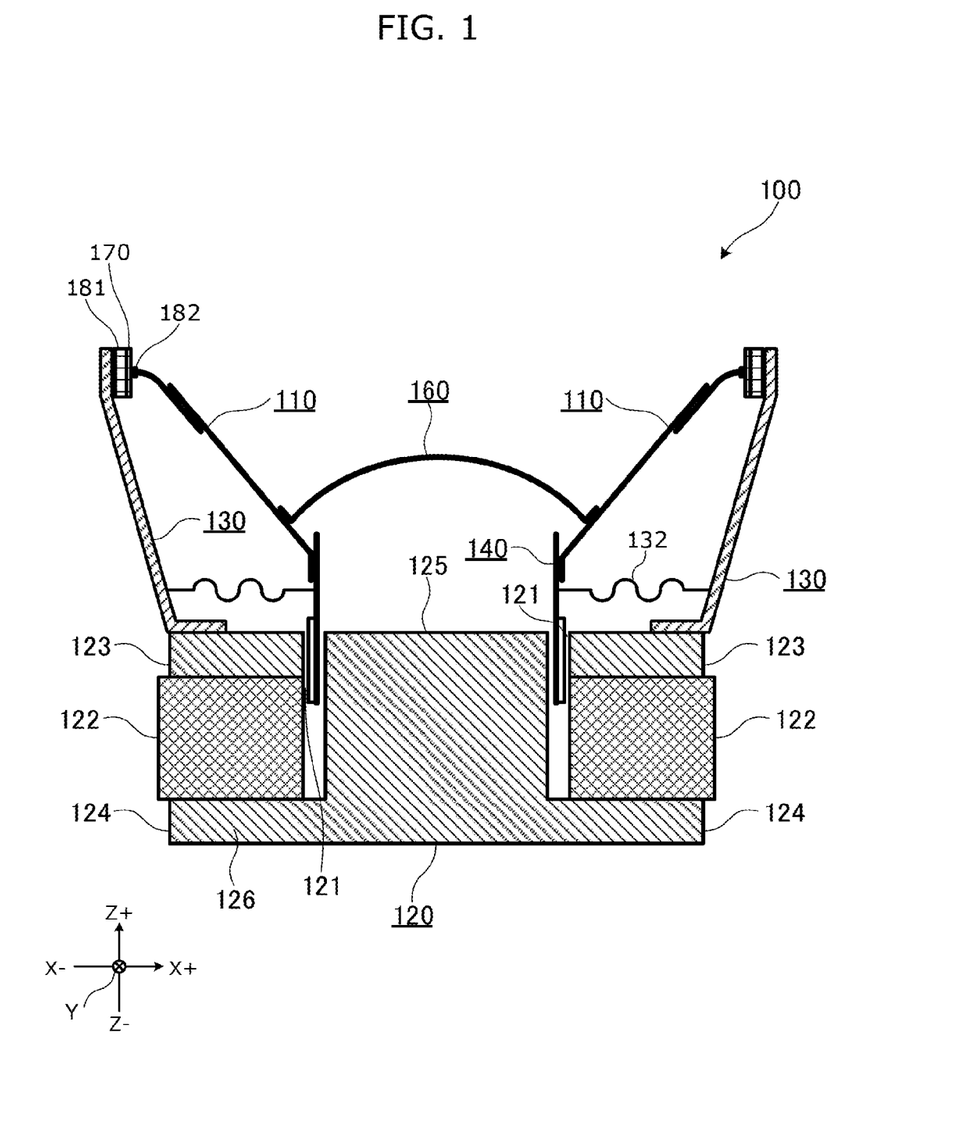
FIG. 1 is a cross-sectional view of a loudspeaker according to an embodiment.

FIG. 1 is a cross-sectional view of a loudspeaker which is an electroacoustic transducer according to Embodiment 1. Electroacoustic transducer 100 is a loudspeaker which converts an electric signal into sound, and includes diagraph 110, first sliding component 181, second sliding component 182, and first low-friction membrane 170. In the present embodiment, electroacoustic transducer 100 includes magnetic circuit 120, base component 130, damper 132, and voice coil body 140. In electroacoustic transducer 100, the direction along which sound is emitted from electroacoustic transducer 100 is defined as front (positive Z-axis direction in the drawing), and the opposite direction is defined as back (negative Z-axis direction).

Diagraph 110 is a component which vibrates to produce sound. In the present embodiment, diagraph 110 is a component to which voice coil body 140 is coupled. Diagraph 110 produces sound by displacing back and forth (in the Z-axis direction in the drawing) from the neutral position in accordance with the vibration of voice coil body 140 and vibrating the air. Diagraph 110 has a so-called cone shape with a diameter that gradually decreases from the front (positive Z-axis side in the drawing) to the back.

The central portion of diagraph 110 includes a through-hole into which voice coil body 140 is inserted. Dome-shaped center cap 160 is attached to the central portion of diagraph 110 in front of the through-hole so as to cover the through-hole. Center cap 160 attached to diagraph 110 produces the same effects as diagraph 110.

The shape or the like of diagraph 110 is not particularly limited. Examples of the shape of diagraph 110 include a circular cone, an elliptical cone, and a pyramid. A flat shape, such as a circular plate, an elliptical plate, or a flat plate is also possible. The material of diagraph 110 is not particularly limited. Examples of the material include paper and resin.

First sliding component 181 is a tubular component which surrounds the outer peripheral portion of diagraph 110. First sliding component 181 guides the outer peripheral portion of diagraph 110 back and forth. In the present embodiment, first sliding component 181 holds first low-friction membrane 170 on the inner peripheral surface of first sliding component 181. The cross sectional shape perpendicular to the tube axis of the inner peripheral surface of first sliding component 181 corresponds to the shape of the outer peripheral portion of diagraph 110. The cross-sectional shape of the inner peripheral surface of first sliding component 181 has a tubular shape that extends in the tube axis direction. The tube axis of first sliding component 181 extends in the front-back direction (Z-axis direction in the drawing). The inner peripheral surface of first sliding component 181 has a cross-sectional shape which does not change in the front-back direction, and can guide second sliding component 182 smoothly.

The material of first sliding component 181 is not particularly limited, but may be a material to which first low-friction membrane 170 can be firmly attached. For example, when first low-friction membrane 170 can be satisfactorily attached to first sliding component 181 in the high temperature range from at least 100 degrees Celsius and at most 250 degrees Celsius, the material of first sliding component 181 may be a material which is capable of bearing the temperature in terms of quality and structure. In such a case, examples of the material of first sliding component 181 include metal such as aluminum.

Figure 2:
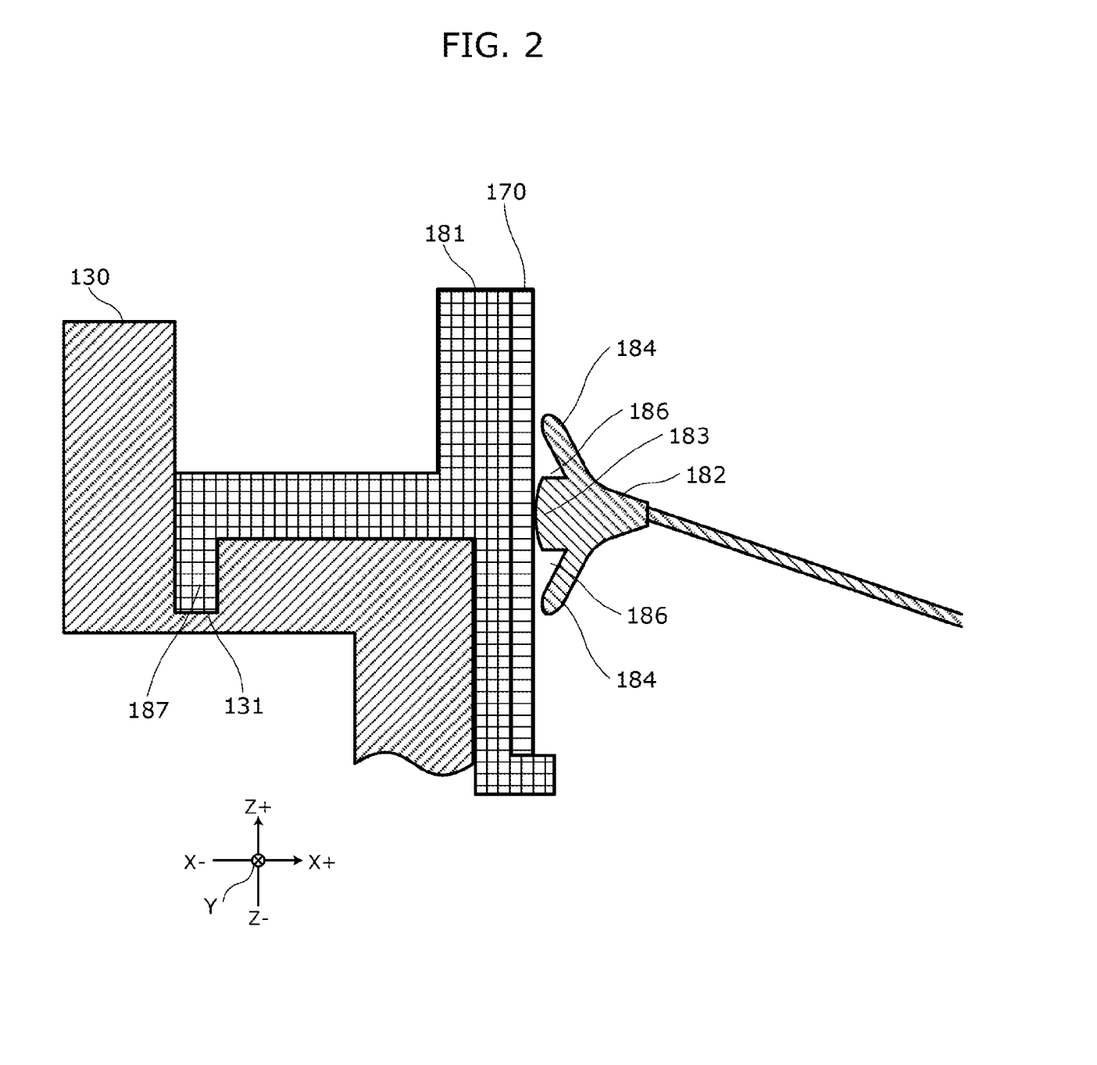
FIG. 2 is a cross-sectional view of a portion where a first sliding component and a second sliding component slide against each other.

Second sliding component 182 is a ring-shaped component which is attached to the outer rim of diagraph 110 to slide against the inner peripheral surface of first sliding component 181 via first low-friction membrane 170. FIG. 2 is a cross-sectional view of a portion where first sliding component 181 and second sliding component 182 slide against each other. The shape of second sliding component 182 is not particularly limited. In the present embodiment, second sliding component 182 includes: ring-shaped abutment portion 183 which abuts the inner peripheral surface of first sliding component 181; and ring-shaped protrusion 184 which are disposed on the both sides of abutment portion 183 in the sliding direction (front-back direction) with spaces between protrusion 184 and abutment portion 183, protrudes from the lateral side of abutment portion 183 in the sliding direction toward the inner peripheral surface of first sliding component 181, and includes an outer peripheral end portion which abuts or is in proximity to the inner peripheral surface of first sliding component 181.

The material of second sliding component 182 is not particularly limited, but may be a material which has a low friction resistance against first low-friction membrane 170. Examples of the material include resin such as polyacetal. The material of second sliding component 182 may be the same as or different from the material of diagraph 110. In the present embodiment, second sliding component 182 is made of a material different from the material of diagraph 110, and is attached to the outer peripheral portion of diagraph 110 via an adhesive.

The cross-sectional shape of the surface of abutment portion 183 facing first sliding component 181 is not particularly limited. In the present embodiment, the central portion of the cross-section of the face in the sliding direction is curved so as to protrude toward first sliding component 181, and has a barreled shape in an overall view. Such a shape reduces the contact area between first sliding component 181 and second sliding component 182, which can reduce kinetic friction that occurs at the time of sliding.

Figure 3:
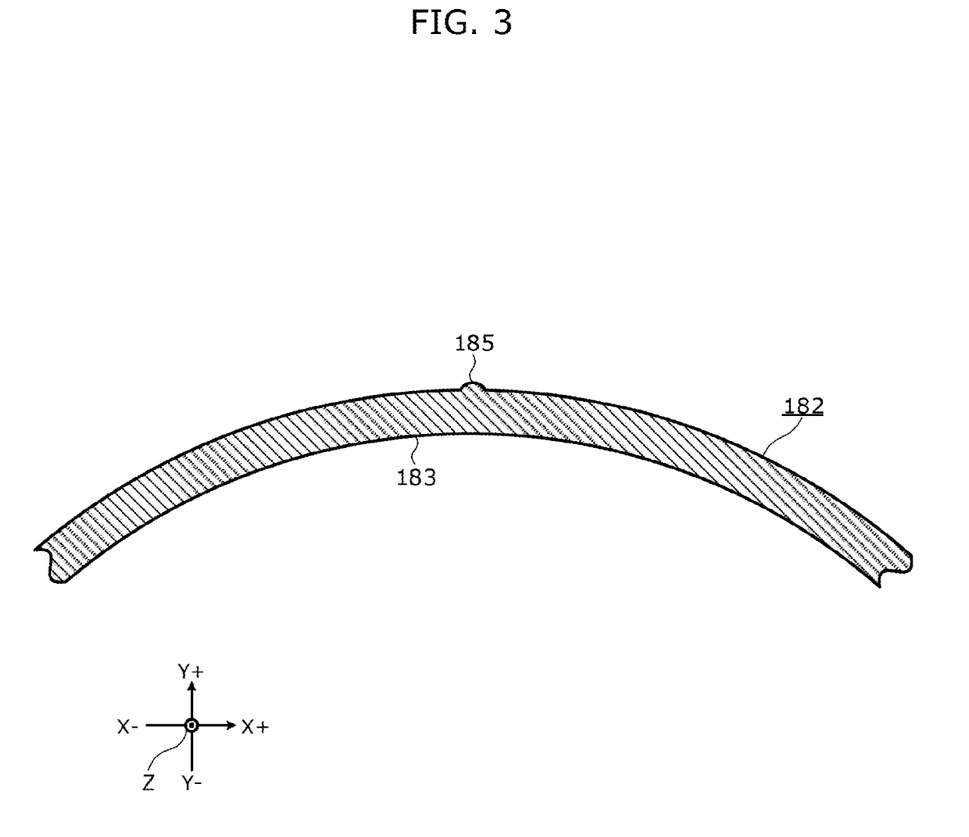
FIG. 3 is a cross-sectional view of a protrusion of an abutment portion.

As illustrated in FIG. 3, abutment portion 183 of second sliding component 182 may include protrusions 185, which protrude toward first sliding component 181, in at least three positions in a circumferential direction. Protrusions 185 are expected to prevent second sliding component 182 from partially contacting first sliding component 181, and prevent distortion of second sliding component 182 at the time of sliding in the sliding direction (front-back direction). Protrusions 185 may be arranged in the circumferential direction at equal intervals, which is expected to further increase the advantageous effect. The shape of each protrusion 185 is not particularly limited. Examples of the shape of protrusion 185 include a smoothly curved shape in which the central portion of protrusion 185 in the sliding direction protrudes toward first sliding component 181. For example, the shape of protrusion 185 may be a domed shape.

Protrusion 184 is a ring-shaped thin plate-shaped portion which protrudes from the inner portion of abutment portion 183 in the radial direction (for example, X-axis direction, Y-axis direction). Protrusion 184 is gradually positioned farther from abutment portion 183 as the distance to the tip portion decreases. Protrusion 184 forms storage portion 186 which stores a predetermined amount of grease (to be described later) in a ring-shaped space between protrusion 184 and abutment portion 183, and supplies the grease to a portion between first sliding component 181 and second sliding component 182. Storage portion 186 allows the sliding portion to hold a predetermined amount of grease, the swollen state of first low-friction membrane 170 to be maintained, and friction that occurs between first sliding component 181 and second sliding component 182 to be reduced.

Figure 4:
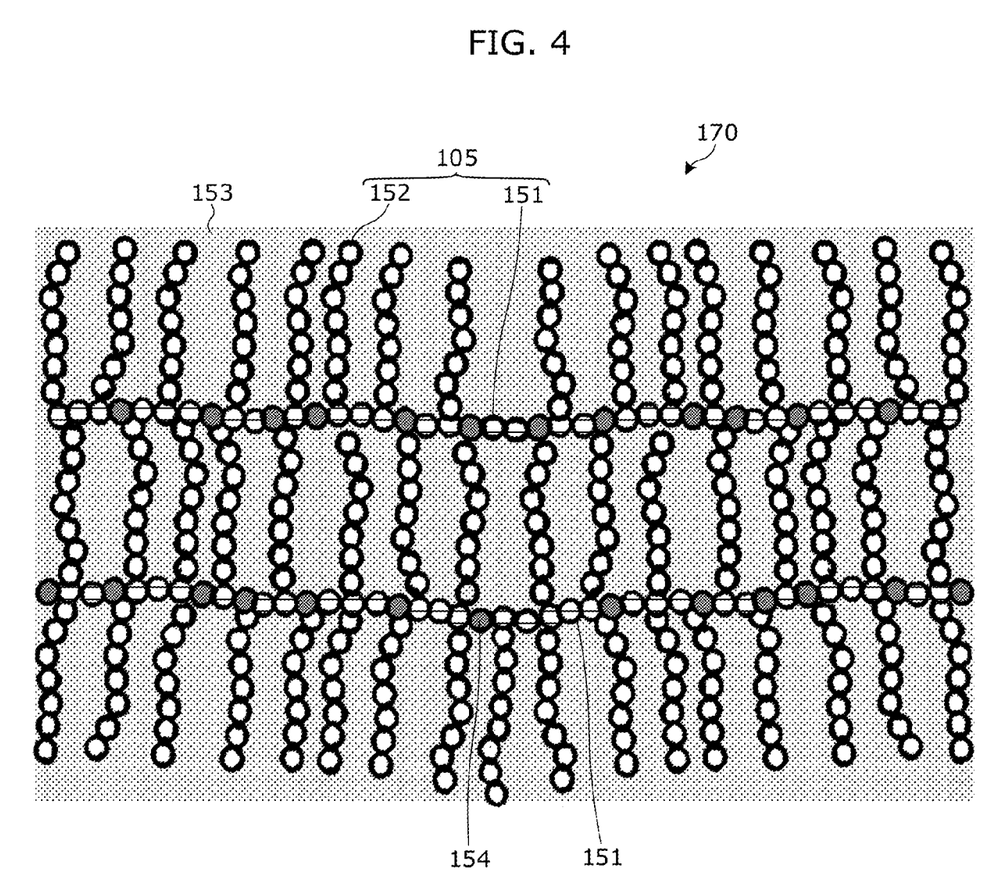
FIG. 4 is a schematic perspective view of a first low-friction membrane.

First low-friction membrane 170 is a membrane interposed between the inner peripheral surface of first sliding component 181 and the outer peripheral surface of second sliding component 182 to reduce friction force that occurs between first sliding component 181 and second sliding component 182. FIG. 4 is a schematic perspective view of first low-friction membrane 170. First low-friction membrane 170 includes: swollen body 105 including first polymer chains 151, and a plurality of second polymer chains 152 which branch from each of first polymer chains 151 as side chains; and grease 153 which permeates first polymer chains 151 and second polymer chains 152 and swells swollen body 105.

First polymer chains 151 are not particularly limited. Examples of first polymer chains 151 include acrylic chains having cross-linking groups 154 which are groups capable of binding covalently by, for example, reaction of the same type of groups under the heating conditions. Cross-linking groups 154 are not particularly limited, but may be, for example, carboxylic acid.

In a state where first low-friction membrane 170 is disposed on the inner peripheral surface of first sliding component 181, as illustrated in FIG. 4, first polymer chains 151 are connected one-dimensionally with cross-linking groups 154 as connection points, and are layered with second polymer chains 152 interposed in between. In FIG. 4, part of swollen body 105 is simply illustrated one-dimensionally. First polymer chains 151 may have a two-dimensional mesh-structure connected also in a direction intersecting the drawing sheet. Moreover, first polymer chains 151 may have a three-dimensional mesh-structure further connected in the direction along the drawing sheet.

Second polymer chains 152 are silicone chains having siloxane linkage. A specific example of second polymer chains 152 is dimethyl silicone chains.

For example, grease 153 has such a consistency that grease 153 permeates second polymer chains 152 and does not fall off from second polymer chains 152 due to its own weight in any way. The term "consistency" refers to a physical property value which indicates hardness of grease. In the present embodiment, grease 153 is a silicone grease which has a consistency at which grease 153 as a single body does not flow due to its own weight and has a high affinity for first polymer chains 151 and second polymer chains 152. Examples of silicone include polydimethylsiloxane. Specifically, grease 153 has a consistency selected from the range from at least 265 to at most 430. Grease 153 with a consistency that is less than 265 becomes resistant to the vibration of diagraph 110, which leads to a decrease in sound pressure. Grease 153 with a consistency that is greater than 430 is unlikely to stay on first low-friction membrane 170, so that the effects are not maintained. How to adjust the consistency of grease 153 is not particularly limited. For example, by mixing dimethyl silicone with a kinetic viscosity of approximately 200 cst into silicone grease, grease 153 with a desired consistency can be obtained. In this case, in terms of ratio by weight, dimethyl silicone may exceed silicone grease.

As described above, by using silicone graft polymer with methacrylate main chains for swollen body 105, grease 153 containing silicone can be swollen till the volume of swollen body 105 is swollen twice or more, the friction at the sliding portion can be reduced, and abnormal noise produced by friction and the like can be prevented.

The method of forming first low-friction membrane 170 between first sliding component 181 and second sliding component 182 is not particularly limited. In the present embodiment, a dispersion liquid which contains swollen body monomers in a dispersed state and to which a cross-linking agent has been added is applied to the sliding portion, and a membrane of swollen body 105 is formed on at least one surface of the sliding portion by applying energy, such as heat, to the dispersion liquid. After removing the dispersion liquid by vitalization or the like, a grease for swelling permeates swollen body 105, so that first low-friction membrane 170 in a swollen state is formed.

The swollen body monomers are substances which include: relatively short (for example, nano order length) first polymer chains 151 that contain cross-linking groups; and a plurality of second polymer chains 152 that branch from each of first polymer chains 151. First polymer chains 151 are connected by cross linkage and the swollen monomers change into a huge (for example, micron order thickness) film-shaped structure.

The cross-linking agent is not particularly limited, and is appropriately selected according to the type of cross-linking group 154 of first polymer chains 151. For example, when cross-linking group 154 is carboxylic acid, polyfunctional isocyanate may be used as the cross-linking agent.

Examples of the liquid in which swollen body monomers are dispersed include dimethyl ether.

Magnetic circuit 120 is a component which generates a permanent magnetic flux which acts on the magnetic flux changed in accordance with an electric signal provided to voice coil 140. Magnetic circuit 120 is fixed to base component 130 so as to be positioned behind diagraph 110, and includes ring-shaped magnetic gap 121 opposite to diagraph 110. Magnetic gap 121 is a space in which a permanent magnetic flux is generated in the direction intersecting the magnetic flux generated in voice coil body 140. In the present embodiment, the gap length of magnetic gap 121 is longer than and at most three times as long as the thickness of the portion of voice coil body 140 inserted into magnetic gap 121. In addition, the clearance between magnetic gap 121 and the portion of voice coil body 140 inserted into magnetic gap 121 is at least 0.01 μm and less than 200 μm.

In the present embodiment, magnetic circuit 120 is of an external magnet type, and includes cylindrical magnet 122 which is magnetized in the front-back direction, ring-shaped top plate 123 disposed on the face of magnet 122 closer to diagraph 110, circular base plate 124 disposed on the face of magnet 122 further from top plate 123, and center pole 125 which is inserted into the through-hole of top plate 123 from the central portion of base plate 124 and forms magnetic gap 121 between center pole 125 and top plate 123. Moreover, base plate 124 and center pole 125 are integrally formed.

Top plate 123, base plate 124, and center pole 125 are made of magnetic materials. For example, a neodymium magnet having a high magnetic energy is used as magnet 122. With this, the thickness of magnet 122 can be reduced, leading to a reduction in overall thickness of electroacoustic transducer 100. Moreover, it is also possible to achieve reduction in weight.

The type of magnetic circuit 120 included in electroacoustic transducer 100 is not particularly limited, and magnetic circuit 120 of an internal magnet type may be used.

Magnet 122 is a permanent magnet having a circular plate shape, and having a central portion with a through-hole into which center pole 125 is inserted. Magnet 122 has one end representing the north pole, and the other end representing the south pole in the thickness direction (in the front-back direction). Top plate 123 is fixed to the surface of magnet 122 on the north pole side or on the south pole side, and base plate 124 is fixed to the opposite surface of magnet 122. The method of fixing top plate 123, magnet 122, and base plate 124 is not particularly limited. In the present embodiment, an adhesive is used for the fixation. A fastener, such as a screw or a rivet, may be used for the fixation.

Voice coil body 140 is a component which has a back end portion (end portion on the negative Z-axis side in the drawing) disposed in magnetic gap 121 of magnetic circuit 120 and a front end portion (end portion on the positive Z-axis side in the drawing) coupled to diagraph 110. Voice coil body 140 generates a magnetic flux in accordance with an input electric signal, and vibrates back and forth by interacting with magnetic circuit 120.

The coil axis (central axis) of voice coil body 140 is aligned with the direction of vibration (amplitude) of diagraph 110 (z-axis direction in the drawing), and is orthogonal to the magnetic flux lines in magnetic gap 121. The coil axis of voice coil body 140 coincides with the tube axis of first sliding component 181 and the tube axis of second sliding component 182. The back-and-forth vibration of voice coil body 140 also causes diagraph 110 and second sliding component 182 to vibrate back and forth.

In the present embodiment, voice coil body 140 includes a coil formed by winding a metal wire several times into loops (into a cylindrical shape) and a bobbin around which the coil is wound. The bobbin is a tubular component made of a material such as aluminum or resin, and incudes a front end portion that is coupled to diagraph 110 and a back end portion disposed in magnetic gap 121. Voice coil body 140 included in electroacoustic transducer 100 is not limited to the examples described above. For example, voice coil body 140 without a bobbin as used in a microspeaker may be used.

Base component 130 is a so-called frame serving as a structural base of electroacoustic transducer 100, and holds magnetic circuit 120 and diagraph 110 at predetermined positions. Base component 130 is made of, for example, metal or resin. In the present embodiment, base component 130 is made of resin, and first sliding component 181 made of aluminum is attached to base component 130. Specifically, base component 130 abuts the outer peripheral surface of first sliding component 181, and incudes, at the outer side than the abutment portion, recess 131 into which insertion portion 187 of first sliding component 181 is fitted. This increases the strength of attachment of base component 130 and first sliding component 181, and precisely determines the relative positional relation between base component 130 and first sliding component 181.

Damper 132 is a component which supports diagraph 110 and voice coil body 140 at neutral positions relative to magnetic circuit 120 and base component 130. Damper 132 has flexibility which allows expansion and contraction due to the vibrations of diagraph 110 and voice coil body 140, and has resilience which maintains diagraph 110 and voice coil body 140 at neutral positions when diagraph 110 and voice coil body 140 do not vibrate. This prevents second sliding component 182 from coming off from the end portion of first sliding component 181. The shape of damper 132 is not particularly limited. In the present embodiment, damper 132 is a ring-shaped component that connects base component 130 and voice coil body 140 and is curved in a wavelike manner.

Next, an operation of electroacoustic transducer 100 according to the embodiment will be described. When an electric signal is provided to voice coil body 140, a magnetic flux corresponding to the electric signal is generated in voice coil body 140. Voice coil body 140 vibrates back and forth by interacting with the permanent magnetic flux in magnetic gas 121. Diagraph 110 coupled to voice coil body 140 also vibrates back and forth with second sliding component 182.

Here, since voice coil body 140 is in contact with center pole 125 via second low-friction membrane 150, voice coil body 140 functions as a guide mechanism, and vibrates only back and forth which is the extension direction of center pole 125. Moreover, second sliding component 182 also vibrates only back and forth by being guided by first sliding component 181 which is coaxially disposed with the coil axis of voice coil body 140. With this, voice coil body 140 and diagraph 110 vibrate back and forth while being prevented from waving or laterally vibrating. First sliding component 181 and second sliding component 182 slide against each other, and voice coil body 140 and center pole 125 slide against each other. First low-friction membrane 170 and second low-friction membrane 150 have low friction, and thus, the friction force has little effect on the vibrations of voice coil body 140 and diagraph 110. Accordingly, the vibration which accurately corresponds to the electric signal provided to the coil of voice coil body 140 can be transmitted to diagraph 110, which allows sound that is true to the original sound to be produced.

Moreover, since the vibrations of voice coil body 140 and diagraph 110 are guided by sliding, a damper does not need to be used to maintain the straightness of the vibrations of voice coil body 140 and diagraph 110, which leads to a reduction in loss due to the damper.

First sliding component 181 and second sliding component 182 slide against each other via first low-friction membrane 170 with no gap in between. Hence, the vibrations of air in opposite phases generated in front of and behind diagraph 110 do not meet, and do not cancel with each other. Hence, sound can be efficiently produced.

In addition, since voice coil body 140 and diagraph 110 vibrate only in a one axis direction along center pole 125 and first sliding component 181 having a tube axis that is coaxially disposed with center pole 125, the gap length of magnetic gap 121 can be significantly reduced (narrowed). Accordingly, leakage of the magnetic flux generated in magnetic gap 121 can be reduced, and the magnetic flux density can be increased, leading to electroacoustic transducer 100 capable of producing high sound pressure.

Moreover, even when diagraph 110, magnet 122 and the like are downsized, it is possible to provide electroacoustic transducer 100 which produces a desired sound pressure, and to downsize electroacoustic transducer 100.

Figure 5:
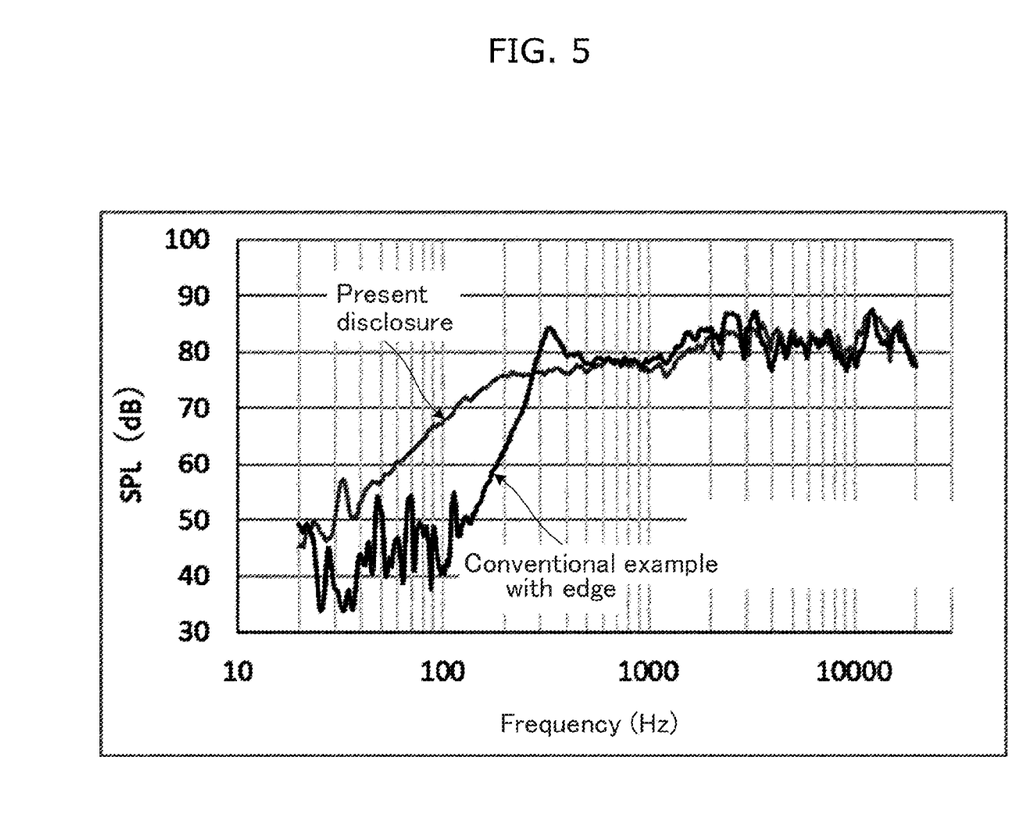
FIG. 5 illustrates sound pressure frequency characteristics of the loudspeaker according to the embodiment.

FIG. 5 is a graph illustrating sound pressure frequency characteristics of electroacoustic transducer 100 according to the present disclosure including diagraph 110 with an outer peripheral portion that is 9 cm in diameter. As illustrated in FIG. 5, compared with a conventional loudspeaker including a diagraph that is 16 cm approximately in diameter and supported by an edge, electroacoustic transducer 100 that is a relatively small loudspeaker has approximately the same level for mid-high range, and provides low-range output more efficiently. As described above, the loudspeaker according to the present disclosure can be adopted as a full-range loudspeaker which is relatively small in size and widely covers up to low ranges.

The present disclosure is not limited to the embodiment above. For example, other embodiments that can be realized by arbitrarily combining the structural components described in the present specification or by removing some of the structural components may be included in the embodiments of the present disclosure. Furthermore, modifications obtainable through various changes to the above-described embodiment that can be conceived by a person of ordinary skill in the art without departing from the essence of the present disclosure, that is, the meaning of the recitations in the claims are also included in the present disclosure.

Figure 6:
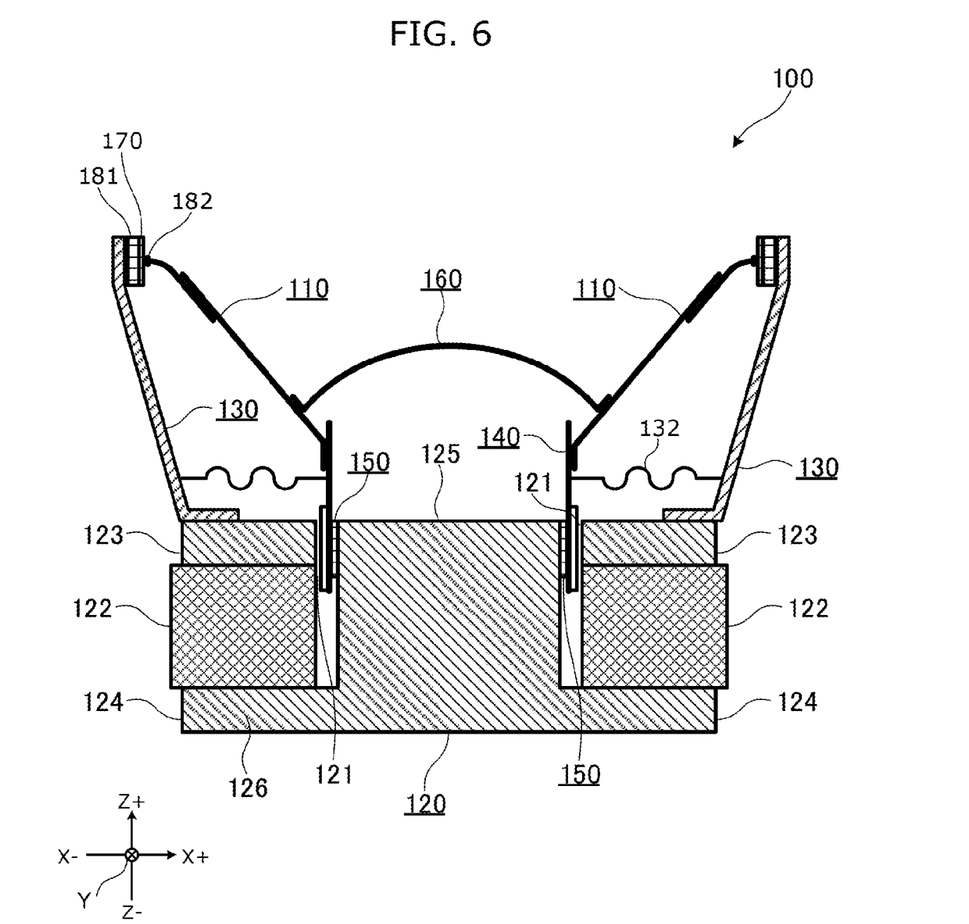
FIG. 6 is a cross-sectional view of another example 1 of the loudspeaker.

For example, as illustrated in FIG. 6, in addition to first low-friction membrane 170 disposed between first sliding component 181 and second sliding component 182, electroacoustic transducer 100 may include second low-friction membrane 150 on the outer peripheral surface of the end portion of center pole 125 closer to diagraph 110. Voice coil body 140 is in contact with center pole 125 via second low-friction membrane 150. In other words, a guide mechanism may be formed in which voice coil body 140 coupled to diagraph 110 functions as a first component, center pole 125 functions as a second component held by base component 130, and second low-friction membrane 150 disposed on the sliding portion between voice coil body 140 and center pole 125 guides the vibration of diagraph 110 in a one axis direction that is the front-back direction (Z-axis direction in the drawing).

Second low-friction membrane 150 may be the same type of membrane as first low-friction membrane 170, or may be a different type of membrane from first low-friction membrane 170. In second low-friction membrane 150, the same type of swollen body 105 as that of first low-friction membrane 170 is included, but the substance which swells swollen body 105 is a liquid containing silicone which penetrates second polymer chains 152. Examples of silicone include polydimethylsiloxane.

Figure 7:
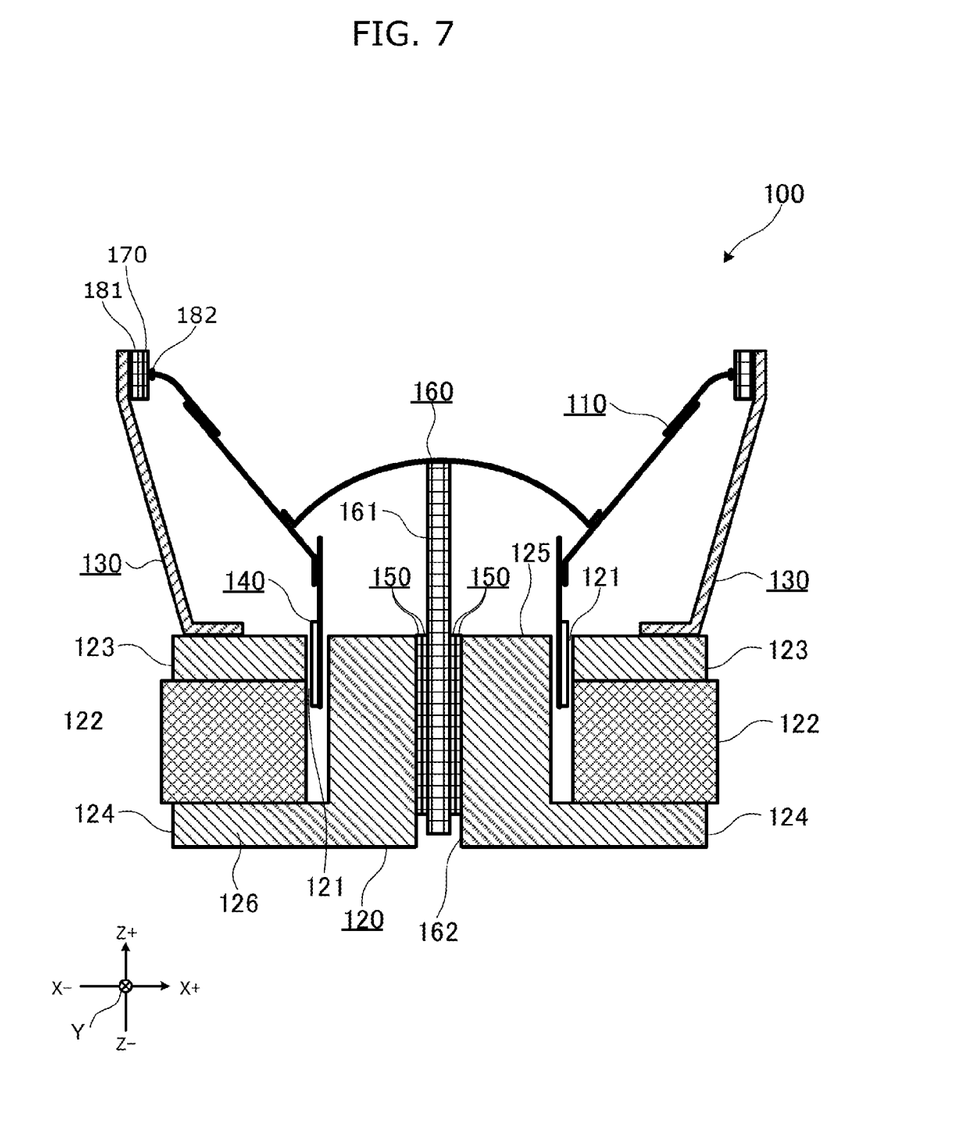
FIG. 7 is a cross-sectional view of another example 2 of the loudspeaker.

Moreover, as illustrated in FIG. 7, as a component different from voice coil 140, electroacoustic transducer 100 may include round-bar shaped first component 161 which has one end portion coupled to center cap 160 and extends toward magnetic circuit 120. First component 161 is connected to diagraph 110 via center cap 160. Moreover, center pole 125 of magnetic circuit 120 which also functions as a second component includes guide portion 162 which has a through-hole shape and guides first component 161 along one axis. Second low-friction membrane 150 may face both first component 161 and guiding portion 162.

Moreover, in the embodiment, electroacoustic transducer 100 which converts an electric signal into sound has been described as an example, but electroacoustic transducer 100 may be a microphone or a sensor which converts sound into an electric signal.

Moreover, the consistency of grease 153 used for first low-friction membrane 170 is more desirably selected from a range from at least 300 to at most 400.

Moreover, diagraph 110 and second sliding component 182 may be made of the same material, and may be integrally formed.

A surface treatment may be applied to the surface of swollen body 105 on which a membrane is formed in order to increase the binding force with swollen body 105. With this, first low-friction membrane 170 and second low-friction membrane 150 can be more firmly fixed to the sliding portion, which enhances the life of the sliding portion. Examples of the surface treatment include coating the surface with glass particles such as silica dioxide (silica).

Moreover, the example has been described where one first component 161 is coupled to the center of center cap 160, but first component 161 may be directly coupled to diagraph 110 when no center cap 160 is included. A plurality of first components 161 may be coupled to diagraph 110 or center cap 160.

Moreover, it has been described that the shapes of diagraph 110, magnetic circuit 120, and voice coil body 140 are circular in a plane view, but the present disclosure is not limited to such an example. The shapes in a plane view may be oval or rectangular.

The type of magnetic circuit 120 is not limited to the external magnet type and the internal magnet type, but may also be a mixed structure of the internal magnet type and the external magnet type.

The magnet used in magnetic circuit 120 may be any magnet such as samarium iron magnet, ferritic magnet, or neodymium magnet.

Moreover, a cone-shaped loudspeaker, which is widely applied to cars or audio and visual fields, has been mainly described as the electroacoustic transducer. However, the electroacoustic transducer may be applied to a compact flat microspeaker, receiver, and the like which are used in a smart phone, a mobile phone, a personal computer, headphones, earphones, and the like, and the same advantageous effects can be obtained.

While an embodiment has been described herein above, it is to be appreciated that various changes in form and detail may be made without departing from the spirit and scope of the present disclosure as presently or hereafter claimed.

Further Information about Technical Background to this Application

The disclosure of the following patent application including specification, drawings, and claims are incorporated herein by reference in their entirety: Japanese Patent Application No. 2021-124875 filed on Jul. 30, 2021.

INDUSTRIAL APPLICABILITY

The present disclosure is useful, for example, for a high-sound-pressure loudspeaker, a compact loudspeaker, a lightweight loudspeaker, a high-performance microphone, and a high-performance sensor.

The invention claimed is:
1. An electroacoustic transducer comprising:
a diaphragm which vibrates to produce sound or which is vibrated by sound;
a first sliding component which is tube-shaped and surrounds an outer peripheral portion of the diaphragm;
a second sliding component which is ring-shaped and is attached to an outer rim of the diaphragm; and
a first low-friction membrane which is interposed between the inner peripheral surface of the first sliding component and an outer peripheral surface of the second sliding component, the second sliding component being slidable against the first low-friction membrane such that the second sliding component is slidable relative to the first sliding component,
wherein the first low-friction membrane includes:
a swollen body which includes a first polymer chain and a plurality of second polymer chains which branch from the first polymer chain as side chains; and
a grease which permeates the plurality of second polymer chains.
2. The electroacoustic transducer according to claim 1, wherein the second sliding component includes:

an abutment portion which is ring-shaped and abuts the inner peripheral surface of the first sliding component; and a protrusion which is ring-shaped and is positioned on both sides of the abutment portion in a sliding direction with a space between the abutment portion and the protrusion, the protrusion protruding toward the inner peripheral surface of the first sliding component, the protrusion including an outer peripheral end portion which abuts or is in proximity to the inner peripheral surface of the first sliding component.

3. The electroacoustic transducer according to claim 1, wherein the second sliding component includes protrusions in at least three positions in a circumferential direction, the protrusions protruding toward the first sliding component.

4. The electroacoustic transducer according to claim 1, wherein the first sliding component is made of metal, and the second sliding component is made of resin.

5. The electroacoustic transducer according to claim 1, wherein the diaphragm and the second sliding component are integrally formed.

6. The electroacoustic transducer according to claim 1, comprising:

a first component which is coupled to the diaphragm or an inner side of a center cap;

a second component which guides the first component by sliding with the first component; and a second low-friction membrane which is disposed on at least one of a sliding surface of the first component or a sliding surface of the second sliding component.

7. The electroacoustic transducer according to claim 1, wherein the grease included in the first low-friction membrane has a consistency selected from a range from at least 265 to at most 430.

* * * * *